United States Patent [19]

Tokuda et al.

[11] Patent Number: 4,843,032
[45] Date of Patent: Jun. 27, 1989

[54] PROCESS FOR PRODUCING A DFB LASER WITH A DIFFRACTION GRATING SUPERLATTICE

[75] Inventors: Yasunori Tokuda; Kenzo Fujiwara, both of Amagasaki, Japan

[73] Assignee: Mitsubishi Denki Kabushiki Kaisha, Japan

[21] Appl. No.: 213,354

[22] Filed: Jun. 30, 1988

Related U.S. Application Data

[62] Division of Ser. No. 828,375, Feb. 11, 1986.

[30] Foreign Application Priority Data

Feb. 12, 1985 [JP] Japan .................................. 60-25415
Oct. 2, 1985 [JP] Japan ................................. 60-219344

[51] Int. Cl.⁴ .................. H01L 21/203; H01L 21/265
[52] U.S. Cl. ............................. 437/129; 148/DIG. 71; 148/DIG. 90; 148/DIG. 95; 148/DIG. 106; 148/DIG. 160; 357/17; 372/45; 372/96; 437/19; 437/22; 437/110; 437/133; 437/147; 437/167; 437/936
[58] Field of Search ...................... 148/DIG. 3, 30, 35, 148/56, 65, 71, 72, 76, 90, 94, 95, 106, 110, 160, 169; 357/16, 17; 372/45, 46, 50, 96; 437/19, 22, 23, 81, 82, 105, 107, 108, 110, 126, 129, 133, 147, 167, 936, 987

[56] References Cited

U.S. PATENT DOCUMENTS

| | | |
|---|---|---|
| 4,378,255 | 3/1983 | Holonyak, Jr. et al. ............ 437/107 |
| 4,578,127 | 3/1986 | Gossard et al. ..................... 437/107 |
| 4,706,255 | 11/1987 | Thornton et al. ..................... 372/46 |
| 4,720,836 | 1/1988 | Fukuzawa et al. ................... 372/96 |
| 4,731,789 | 3/1988 | Thornton ............................. 372/45 |
| 4,748,132 | 5/1988 | Fukuzawa et al. ................. 437/176 |
| 4,750,183 | 6/1988 | Takahashi et al. .................... 357/17 |
| 4,751,194 | 6/1988 | Cibert et al. ........................ 437/126 |
| 4,752,933 | 6/1988 | Uomi et al. .......................... 372/96 |
| 4,752,934 | 6/1988 | Fukuzawa et al. ................... 372/46 |
| 4,771,010 | 9/1988 | Epler et al. ......................... 437/133 |
| 4,788,689 | 11/1988 | Tokuda et al. ....................... 372/46 |
| 4,794,606 | 12/1988 | Kondou et al. ...................... 372/45 |
| 4,794,611 | 12/1988 | Hara et al. ........................... 372/45 |
| 4,802,181 | 1/1989 | Iwata ................................... 357/16 |
| 4,811,354 | 3/1989 | Uomi et al. .......................... 372/45 |

OTHER PUBLICATIONS

Laidig et al., "Disorder of an AlAs-GaAs Superlattice by Impurity Diffusion," Appl. Phys. Lett. 38(10), May 15, 1981, pp. 776-78.

Laidig et al., "Embedded-Mirror Semiconductor Laser," Appl. Phys. Lett., 45(5), Sep. 1, 1984, pp. 485-487.

Primary Examiner—Brian E. Hearn
Assistant Examiner—William Bunch
Attorney, Agent, or Firm—Leydig, Voit & Mayer

[57] ABSTRACT

A semiconductor optical element having a layer which exhibits a function of diffraction grating between a first cladding layer and a second cladding layer, wherein the layer which exhibits the function of diffraction grating consists of a superlattice layer in which crystal layers are periodically mixed to constitute a semiconductor grating layer.

9 Claims, 5 Drawing Sheets

(a)

(b)

(c) (e)

(d) (f)

(a)

(b)

(c)

(e)

(d)

(f)

PROCESS FOR PRODUCING A DFB LASER WITH A DIFFRACTION GRATING SUPERLATTICE

This application is a division of Application Ser. No. 06/828,375 filed Feb. 11, 1986.

BACKGROUND OF THE INVENTION

The present invention relates to a semiconductor optical element having a layer which exhibits a function of diffraction grating, and to a process for producing the same.

FIG. 1 shows a conventional semiconductor optical element such as a semiconductor laser element having a layer which exhibits a function of diffraction grating. Namely, FIG. 1 is a section view showing the structure of layers of, for example, a heterostructure laser, or a GaAs/AlGaAs distributed feedback (DFB) type laser disclosed in Nakamura et al, Appl. Phys. Lett. 27, 403 (1975). In FIG. 1, reference numeral 1 denotes a first electrode, 2 denotes a GaAs substrate to one surface of which is connected the first electrode, 3 denotes a first cladding layer which consists of an n-type AlGaAs layer formed on the upper surface of the substrate 2, reference numeral 4 denotes an active layer which consists of a GaAs layer formed on the upper surface of the first cladding layer, 5 denotes an optical guide layer which consists of an AlGaAs layer and which has a diffraction grating 6 formed by periodically engraving grooves, 7 denotes a second cladding layer which consists of a p-type AlGaAs layer formed on the upper surface of the optical guide layer 5 via the diffraction grating 6, reference numeral 8 denotes a cap layer which consists of a p-type GaAs layer formed on the upper surface of the second cladding layer, 9 denotes a second electrode formed on the upper surface of the cap layer, and 10 denotes a laser beam.

The operation will be described below. If an electric current greater than a threshold value is supplied across the first electrode 1 and the second electrode 9, injected carriers (electrons and positive holes) are confined in the active layer 4 and recombine to emit light which propagates through an optical waveguide sandwiched by the first and second cladding layers 3, 7. At this moment, only the light having a particular oscillation wavelength $\lambda(=2n\Lambda/l)$ (where n denotes a refractive index of the optical waveguide, and l denotes a degree) defined by a period $\Lambda$ of the diffraction grating is amplified by positive feedback to undergo laser oscillation having an intense wavelength selectivity, owing to the optical guide layer with diffraction grating 6 having a sawtoothed periodic distribution of refractive indexes formed by engraving the grooves.

The conventional semiconductor optical element having a layer which exhibits a function of diffraction grating is produced by a method shown in FIGS. 2(a) to 2(d). First, as shown in FIG. 2(a), on the substrate 2 are epitaxially grown the first cladding layer 3, active layer 4, and optical guide layer 5. Next, as shown in FIG. 2(b), on the optical guide layer 5 is formed a periodically masked diffraction grating pattern 11 by, for example, holographic interference lithography, electron beam lithography, or a like method. Relying upon a chemical etching or dry etching effected through the diffraction grating mask pattern 11, sawtoothed grooves are formed in the optical guide layer 5 as shown in FIG. 2(c) and, then, the diffraction grating mask pattern 11 is removed. Thereafter, the second cladding layer 7 and the cap layer 8 are formed as shown in FIG. 2(d) by the epitaxially growing method of the second time, and the first and second electrodes 1, 9 are formed, thereby to complete a semiconductor optical element.

The layer having diffraction grating was formed by engraving the grooves as described above. Therefore, it was difficult to periodically engrave the grooves maintaining good reproduceability and efficiency. Moreover, the crystal had to be grown for the second time on the grooves having a step of about several thousand angstroms, causing the crystallinity of the upper layer to deteriorate. Further, many crystalline defects were inevitably introduced into the interface between the grooves and the upper layer which is the second cladding layer 7.

SUMMARY OF THE INVENTION

The present invention was accomplished in order to eliminate the above-mentioned problems, and its object is to provide a semiconductor optical element in which a layer having a diffraction grating function is formed between the first and second cladding layers, the layer being the one in which a semiconductor superlattice layer, possessing a periodic distribution of the refractive index, is formed by periodically mixing quantum well and barrier layers of the superlattice layer instead of engraving the grooves, making it possible to easily grow the cladding layer on the semiconductor grating layer which has a layer of periodically mixed multiple heteroepitaxial layers to exhibit the function of diffraction grating, and further making it possible to improve crystallinity, to prevent crystalline defects from developing, and hence to improve characteristics of the semiconductor optical element.

DESCRIPTION OF THE PREFERRED EMBODIMENTS

An embodiment of the present invention will be described below with reference to FIGS. 3 to 5.

Figure 1:
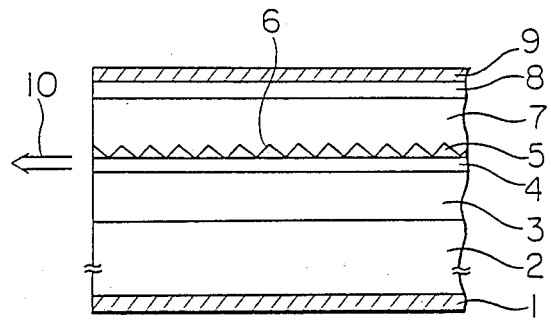
FIG. 1 is a section view showing a conventional DFB-type semiconductor laser device.
Figure 2:
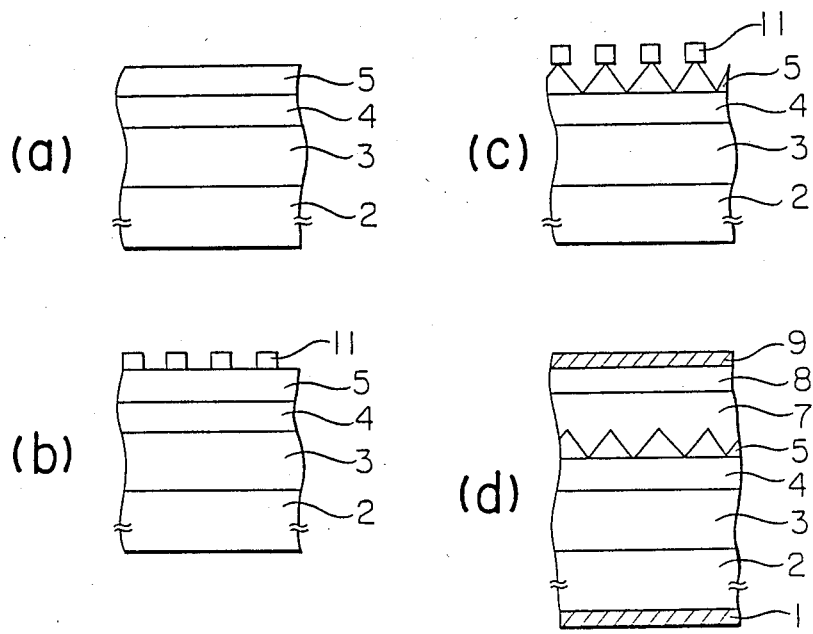
FIG. 2(a) to 2(d) are section views showing a method of producing the conventional DFB-type semiconductor laser device in the order of production steps.
Figure 3:
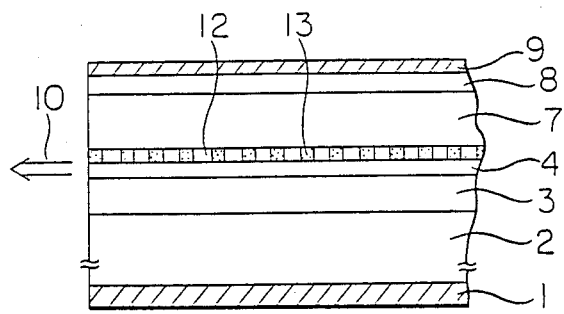
FIG. 3 is a section view showing a DFB-type semiconductor laser which is a semiconductor optical element according to an embodiment of the present invention.
Figure 4:
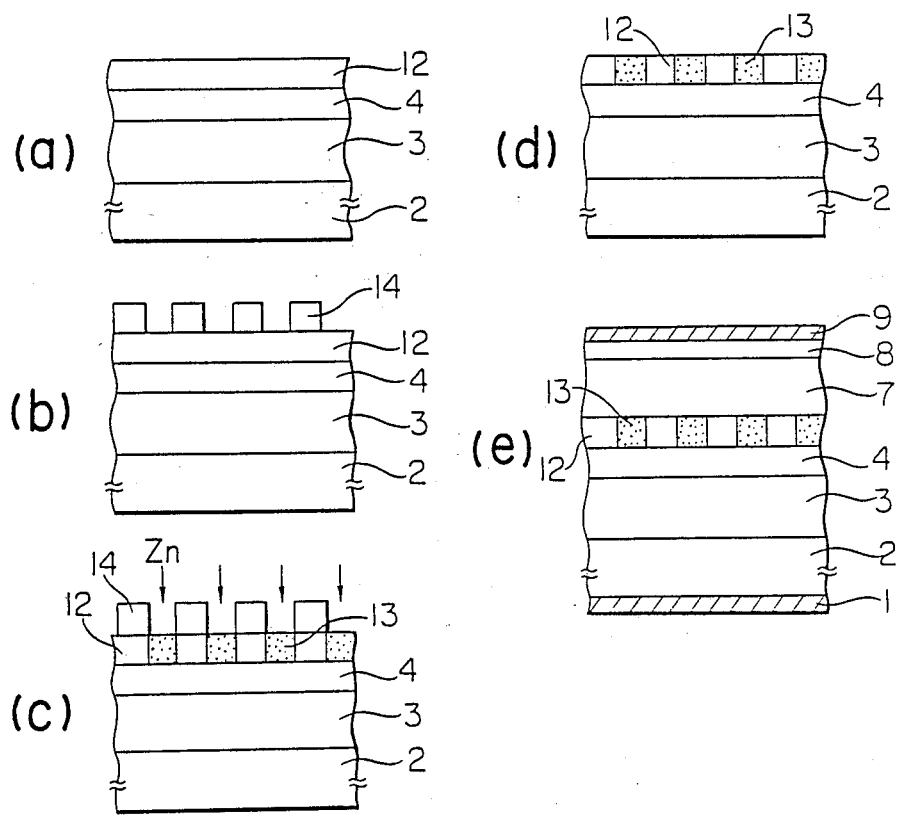
FIGS. 4(a) to 4(e) are section views showing a method of producing the DFB-type semiconductor laser of FIG. 3 in the order of production steps.

FIG. 3 is a section view illustrating a DFB-type semiconductor laser which is a semiconductor optical element according to an embodiment of the present invention, and wherein the same portions as those of FIG. 1 are denoted by the same reference numerals and their description is omitted here. Reference numeral 4 denotes an active GaAs layer which has a flat upper surface without having grooves. Reference numeral 12 denotes a semiconductor superlattice layer that is formed on the active layer 4 and that serves as an optical waveguide layer, and 13 denotes portions of mixed quantum well and barrier layers that are periodically formed in the semiconductor superlattice layer 12. FIG. 3 illustrates the DFB-type semiconductor laser which has an optical guide layer that exhibits the function of diffraction grating sandwiched between the second cladding layer 7 and the active layer 4, the optical guide layer being composed of the semiconductor superlattice layer 12 having portions 13 of mixed crystal layers.

Examples of a method of mixing crystal layers in the semiconductor superlattice layer include a method wherein a masking pattern is periodically formed by, for example, the holographic interference lithography or the electron beam lithography and impurities such as zinc atoms are diffused into the portions that are not covered with the mask in order to mix the crystal layers, a method in which a focussed beam of impurities such as beryllium ions are periodically implanted followed by annealing to mix the superlattice layers, and a method wherein the layers are directly mixed by utilizing the effect of laser annealing which is based upon a high-power photon exposure.

Described below is the case when the DFB-type semiconductor laser of FIG. 3 is to be produced relying upon the zinc diffusion, in conjunction with FIGS. 4(a) to 4(e). First, as shown in FIG. 4(a), on an n-type GaAs substrate 2 are formed a first n-type AlGaAs cladding layer 3, an active GaAs layer 4, and a semiconductor superlattice layer 12 having $Al_xGa_{1-x}As$ layer ($0 < X \leq 1$) and GaAs layers by, for example, the molecular beam epitaxial growth method of the first time.

Then, a masking material 14 is put onto the semiconductor superlattice layer 12 as shown in FIG. 4(b), and a masking pattern is formed by the electron beam lithography. As shown in FIG. 4(c), the masking and semiconductor materials are annealed at a temperature of several hundred degrees, for example, at 600° C. together with $ZnAs_2$ to diffuse zinc into the semiconductor superlattice layer 12 via the masking material 14, thereby to periodically form portions 13 of mixed crystal layers. The masking material 14 is then removed as shown in FIG. 4(d), and a second p-type AlGaAs cladding layer 7 and a p-type GaAs cap layer 8 are formed by the growing method of the second time like in the growing method of the first time, and then the electrodes 1 and 9 are placed on the structure.

Figure 5:
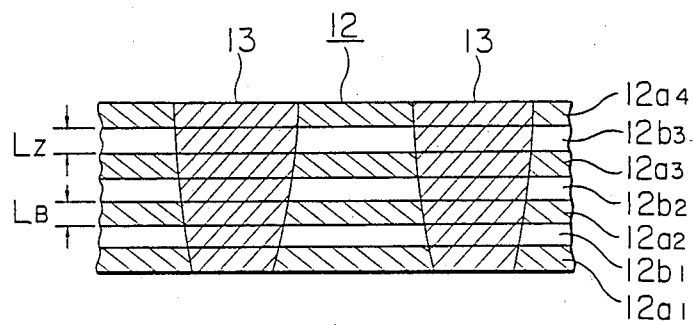
FIG. 5 is a section view showing the structure of a semiconductor superlattice layer.

FIG. 5 is a section view which illustrates in detail the semiconductor superlattice layer 12 of FIG. 3, wherein $12a_1$ to $12a_4$ are $Al_xGa_{1-x}As$ barrier layers. Here, x is between 0.3 and 1 (i.e., AlAs). Reference numerals $12b_1$ to $12b_3$ denote GaAs quantum well layers. The $Al_xGa_{1-x}As$ layers $12a_1$ to $12a_4$ have a thickness $L_B$, and the GaAs layers $12b_1$ to $12b_3$ have a thickness $L_Z$, which ranges from about 2.8 angstroms to not more than 1000 angstroms. These thicknesses $L_B$ and $L_Z$ may or may not be equal to each other. Reference numeral 13 denotes a region of mixed crystal layers where zinc is diffused, i.e., a region where the superlattice layer is destroyed by the diffusion of zinc. It is also allowable to mix the crystal layers by diffusing beryllium, silicon, tin, tellurium or selenium instead of diffusing zinc.

The superlattice layers can be mixed by forming a masking pattern, and then implanting beryllium ions followed by annealing, or by implanting ions into predetermined positions by the focused ion injection method.

Figure 6:
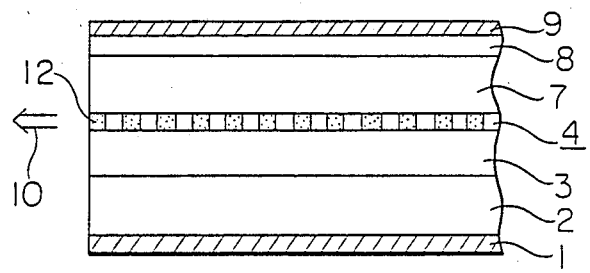
FIG. 6 is a section view showing a semiconductor optical element according to another embodiment of the present invention.

As shown in FIG. 6, furthermore, the active layer 4 may be comprised of the semiconductor layer of a multiple quantum well or superlattice structure so as to have periodic portions of mixed crystal layers, in order to form the DFB-type semiconductor laser that exhibits a function of diffraction grating. The semiconductor laser oscillates in the same manner as the conventional one. According to the invention, refractive index is periodically distributed on a flat plane without utilizing the change in the geometrical shape such as engraving the grooves. Therefore, the crystal can be easily grown on the diffraction grating maintaining good crystallinity and enabling the laser characteristics to be improved.

Furthermore, the semiconductor does not require chemical etching which involves difficulty in regard to reproduceability and yield.

It is further allowable to change the refractive index by more than 5%. In the case of the AlAs-GaAs superlattice, in general, the refractive index decreases if the quantum well and barrier layers are mixed. The effect of diffraction can also be obtained from the difference in the amount of carrier flow between the portions where the superlattice structure remains intact and the portions where the layered structure is mixed.

Figure 7:
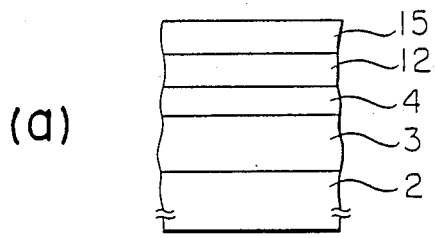
FIGS. 7(a) to 7(f) are section views showing a method of producing the semiconductor optical element according to an embodiment of the present invention in the order of production steps.
Figure 7:
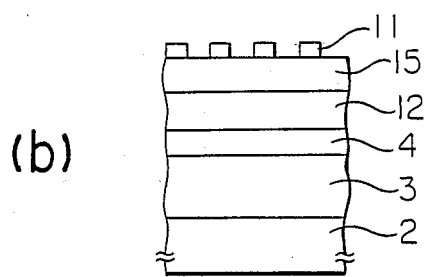
Figure 7:
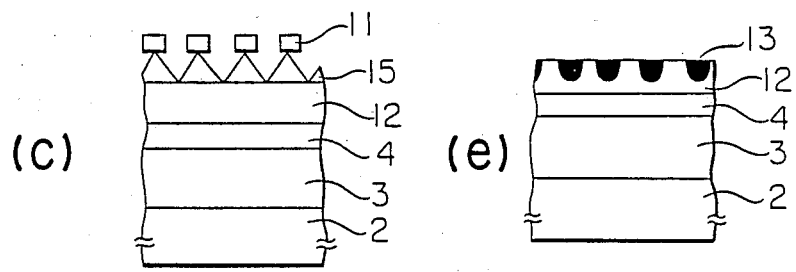
Figure 7:
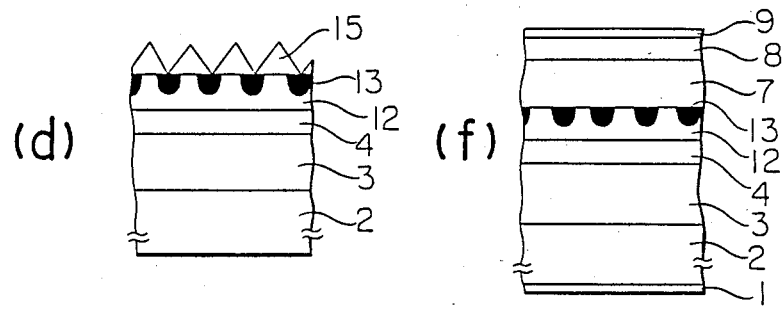

FIG. 7 is a section view which illustrates another process for producing semiconductor optical elements according to the present invention, in conjunction with a DFB-type semiconductor laser in the order of manufacturing steps.

As shown in FIG. 7(a), first, on a substrate 2 are formed a first cladding layer 3, an active layer 4, a semiconductor superlattice layer 12 which serves as an optical waveguide layer and which consists of a first GaAs semiconductor layer and a second semiconductor layer of AlAs ($Al_xGa_{1-x}As$ where x=1) having a forbidden band width larger than that of the first semiconductor layer, and a diffusion masking layer 15 consisting of GaAs, by the epitaxially growing method of the first time (first step). Then, a periodic diffraction grating mask pattern 11 is formed on the diffusion masking layer 15, as shown in FIG. 7(b) (second step). With reference to FIG. 7(c), sawtoothed grooves are formed in the diffusion masking layer 15 by etching effected through the diffraction grating pattern 11 (third step). Thereafter, the diffraction grating pattern (11) that served as the etching mask is removed. By utilizing the diffusion masking layer 15 which has sawtoothed grooves formed as described above, impurities such as zinc atoms or beryllium atoms are diffused as shown in FIG. 7(d), so that quantum well and barrier layers are periodically mixed in the semiconductor superlattice layer 12, thereby to form a grating layer having mixed portions of the layers (fourth step). The impurities such as zinc atoms diffuse at different speeds in GaAs and $Al_xGa_{1-x}As$ ($x \leq 1$). Namely, the impurities diffuse at a slow speed in GaAs. The speed of diffusion differs by more than two times particularly when $X \geq 0.4$ (Lee et al., Solid State Electronics 21, 905 (1978)). To utilize this phenomenon, the diffusion masking layer 15 is formed of GaAs, and the impurities are selectively diffused into the regions of GaAs/AlGaAs semiconductor superlattice layer 12, in order to mix the crystal layers in the semiconductor superlattice layer 12 (Laiding et al., Appln. Phys. Lett. 38, 776 (1981)).

As shown in FIG. 7(e), furthermore, the diffusion masking layer 15 is selectively removed by using, for example, a selective etchant (Logan and Reinhart, J. Appl. Phys. 44, 4172 (1973)) or by sublimation in vacuum (fifth step). Then, as shown in FIG. 7(f), a second AlGaAs cladding layer 7 and a GaAs cap layer 8 are formed on the semiconductor grating layer which includes mixed regions 13 by the growing method of the second time (sixth step). Then, first and second electrodes 1, 9 are formed on both ends thereof.

According to the above-mentioned process for producing a semiconductor laser device having a diffraction grating function, use is made of a flat grating layer formed by periodically mixing quantum well and barrier layers in the semiconductor superlattice layer 12 as an optical guide layer having a function of diffraction grating. Therefore, if the grooved diffusion masking layer 15 is removed after the diffraction grating has been formed, there is obtained a flat re-grown surface, making it easy to grow again a crystal thereon in the sixth step, and to improve characteristics of the semiconductor optical element. In the embodiment of FIGS. 7(a) to 7(f), use is made of the GaAs diffusion masking layer 15 to mix the crystal layers by diffusion in the semiconductor superlattice layer 12. In addition to the aforementioned effects, however, a diffusion mask which is narrowed toward the semiconductor superlattice layer 12 can be easily formed if the etching conditions are selected in the third step. Therefore, the diffusion mask can be finely formed relying upon fine striped diffusion to mix the crystal layers.

In the foregoing was described the case where a single GaAs layer was used as the diffusion masking layer 15. As shown in FIGS. 8(a) to 8(f), furthermore, it is also allowable to use a semiconductor layer consisting of two layers such as a GaAs layer 17 and a thin $Al_xGa_{1-x}As$ layer ($x \leq 1$) 16. The etching conditions and the diffusion profile can be adjusted relying upon the thicknesses of layers and the composition x. For instance, if the selective etching is effected in the third step by using a thin AlAs layer of a thickness of about 20 angstroms as the etching stopping layer 16 on the side of the semiconductor superlattice layer 12, the layer withstands the action of removing and serves as a stopper as shown in FIG. 8(c). The layer can further be used as a stopper against the action for removing the GaAs semiconductor layer 17 that served as the diffusion mask in FIG. 8(e), to facilitate the processing. Further, the semiconductor layer 16 that serves as the stopper may be so selected as to have a sufficiently large aluminum composition x for the semiconductor superlattice layer 12 so that it can be selectively etched. Namely, the semiconductor layer 16 can be etched using HF or the like (Wu et al., Electronics Lett. 21, 559 (1985)), thereby to obtain a flat re-grown surface. When the crystals of the AlAs semiconductor layer 16 and the semiconductor superlattice layer 12 are partly mixed due to diffusion of zinc or the like, the diffraction grating exhibits an increased change in the reffractive index and the function of diffraction grating increases though the surfaces become rugged to some extent.

Figure 8:
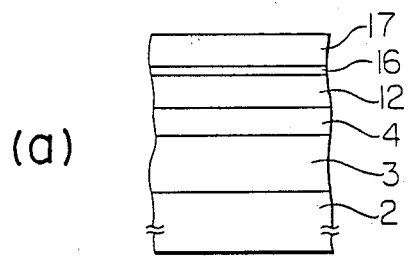
FIGS. 8(a) to 8(f) are section views showing another embodiment of the present invention in the order of production steps.
Figure 8:
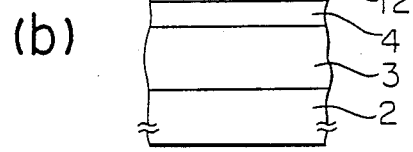
Figure 8:
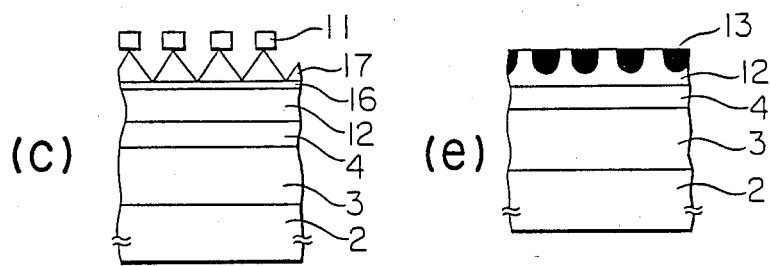
Figure 8:
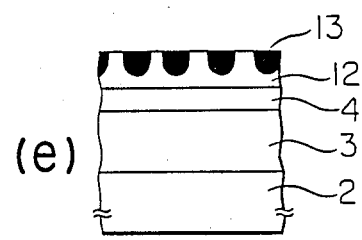
Figure 8:
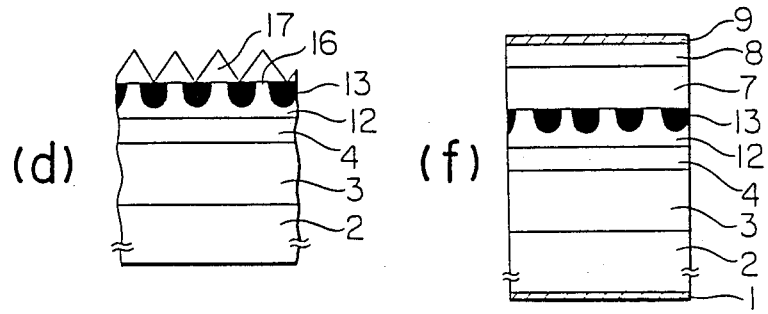
Figure 8:
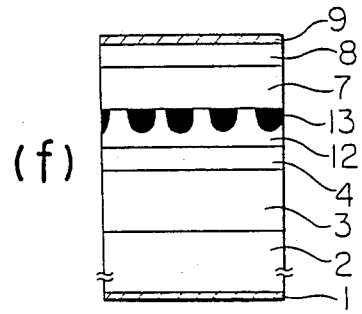

In the manufacturing processes shown in FIGS. 7 and 8, the layer having a function of diffraction grating was used as the optical guide layer like the one shown in FIG. 3. However, the processes of FIGS. 7 and 8 can also be adapted to the device where the layer having a function of diffraction grating serves as the active layer like the one shown in FIG. 6.

The aforementioned embodiments have dealt with the GaAs/AlGaAs type semiconductor laser. However, quite the same effects can also be obtained even with the InP/InGaAsP type semiconductor laser which is a long wavelength laser by using an InP-InGaAsP superlattice or a superlattice having different composition of InGaAsP such as InGaAs lattice matched to InP. The same effects can further be expected even with a semiconductor laser of other types of material. Moreover, the same effects can be expected even with the semiconductor laser of the DBR type.

What is claimed is:

1. A process for producing semiconductor optical elements comprising:
    successively forming a first cladding layer consisting of a semiconductor layer of a first type of conductivity, an active layer, and a semiconductor superlattice layer on a semiconductor substrate of a first type of conductivity;
    periodically mixing crystals in said semiconductor superlattice layer;
    successively forming a second cladding layer consisting of a semiconductor layer of a second type of conductivity and a cap layer consisting of a semiconductor layer of the second type of conductivity on said semiconductor superlattice layer in which the crystal layers are periodically mixed; and
    forming a first electrode on said semiconductor substrate and a second electrode on said cap layer.

2. A process for producing semiconductor optical elements according to claim 1 wherein crystal layers are periodically mixed by periodically diffusing or implanting zinc, beryllium, tin, silicon, tellurium or selenium into the semiconductor superlattice layer.

3. A process for producing semiconductor optical elements according to claim 1 wherein crystal layers are directly mixed periodically in the semiconductor superlattice layer by annealing with a laser.

4. A process for producing semiconductor optical elements according to claim 1 wherein the semiconductor substrate comprises an n-type GaAs substrate, the first cladding layer comprises an n-type AlGaAs layer, the active layer comprises a GaAs layer, the semiconductor superlattice layer comprises $Al_xGa_{1-x}As$ (x is 0.3 to 1) and $Al_yGa_{1-y}As$ layers (y is 0 to 1 and less than x), the second cladding layers comprises a p-type AlGaAs layer, and the cap layer comprises a p-type GaAs layer.

5. A process for producing semiconductor optical elements according to claim 1 wherein the semiconductor substrate comprises a p-type GaAs substrate, the first cladding layer comprises a p-type AlGaAs layer, the active layer comprises a GaAs layer, the semiconductor superlattice layer comprises $Al_xGa_{1-x}As$ (x is 0.3 to 1) and $Al_yGa_{1-y}As$ layers (y is 0 to 1 and less than x), the second cladding layer comprises an n-type AlGaAs layer, and the cap layer comprises an n-type GaAs layer.

6. A process for producing semiconductor optical elements comprising:
    forming a first cladding layer, an active layer, a semiconductor superlattice layer which consists of a plurality of first semiconductor layers and a plurality of second semiconductor layers having a forbidden band width wider than that of the first semiconductor layers, and a masking layer in the order described;

forming a periodic diffraction grating mask pattern in said masking layer;

removing periodic portions of said masking layer through said diffraction grating mask pattern;

forming a grating layer by mixing crystal layers in said semiconductor superlattic layer by diffusing or implanting impurities through said masking layer;

removing said masking layer after said upper lattice layer has been formed; and forming a second cladding layer on the semiconductor grating layer which contains said mixed crystal regions.

7. A process for producing semiconductor optical elements according to claim 6, wherein the masking layer consists of two kinds of semiconductor layers, and the layer on the side of the semiconductor superlattice layer is a semiconductor layer which withstands the removal of periodic masking layer portions.

8. A process for producing semiconductor optical elements according to claim 6 wherein the first semiconductor layer of the semiconductor superlattice layer comprises a GaAs layer, the second semiconductor layer comprises an $Al_xGa_{1-x}As$ (where $\leq 1$), and the masking layer comprises a GaAs layer.

9. A process for producing semiconductor optical elements according to claim 6 wherein the impurity used in the fourth step is any one of zinc, beryllium, tin, silicon, tellurium or selenium.

* * * * *